United States Patent
Torkington et al.

(10) Patent No.: US 7,157,793 B2
(45) Date of Patent: Jan. 2, 2007

(54) DIRECT CONTACT SEMICONDUCTOR COOLING

(75) Inventors: Richard S. Torkington, Mesa, AZ (US); Jon Filreis, Mesa, AZ (US); Kenneth V. Buer, Gilbert, AZ (US)

(73) Assignee: U.S. Monolithics, L.L.C., Chandler, AZ (US)

( * ) Notice: Subject to any disclaimer, the term of this patent is extended or adjusted under 35 U.S.C. 154(b) by 79 days.

(21) Appl. No.: 10/849,097

(22) Filed: May 19, 2004

(65) Prior Publication Data

US 2005/0098880 A1 May 12, 2005

Related U.S. Application Data

(60) Provisional application No. 60/481,630, filed on Nov. 12, 2003.

(51) Int. Cl.
*H01L 23/34* (2006.01)
*G01R 31/26* (2006.01)

(52) U.S. Cl. .......................... 257/714; 438/15
(58) Field of Classification Search ............. 257/714; 361/699; 438/15
See application file for complete search history.

(56) References Cited

U.S. PATENT DOCUMENTS

| | | | |
|---|---|---|---|
| 4,431,579 A | 2/1984 | Yasufuku et al. | |
| 4,961,106 A | 10/1990 | Butt et al. | |
| 5,305,184 A | 4/1994 | Andresen et al. | |
| 5,455,458 A * | 10/1995 | Quon et al. | 257/712 |
| 5,625,227 A * | 4/1997 | Estes et al. | 257/712 |
| 6,771,500 B1 * | 8/2004 | Siegel et al. | 361/699 |
| 6,937,471 B1 * | 8/2005 | Haws et al. | 361/699 |

FOREIGN PATENT DOCUMENTS

| | | |
|---|---|---|
| JP | 53 135579 A | 11/1978 |
| JP | 60 254641 A | 12/1985 |
| JP | 61-2350 | 1/1986 |
| WO | WO 95/27308 A | 10/1995 |

* cited by examiner

*Primary Examiner*—Mark V. Prenty
(74) *Attorney, Agent, or Firm*—Snell & Wilmer L.L.P.

(57) ABSTRACT

Thermal spreading resistance, associated with small geometry electronic features that generate heat on a semiconductor, may be reduced through the addition of a thermally conductive fluid. For example, a dielectric fluid may be used within a volume between a semiconductor package and the semiconductor substrate. Therefore, direct thermal cooling may be employed to reduce the thermal spreading resistance often encountered in MMIC power amplifier devices. Furthermore, exemplary methods to achieve this sealing are described herein.

6 Claims, 3 Drawing Sheets

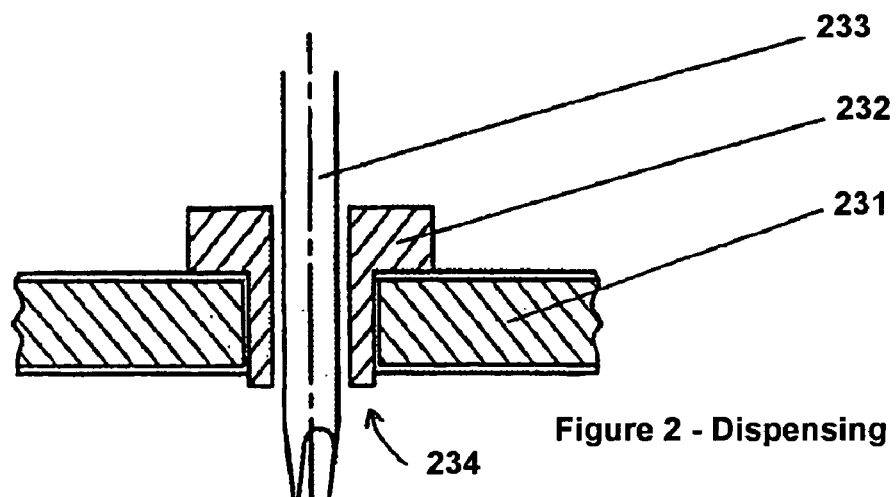
Figure 2 - Dispensing of Cooling Fluid
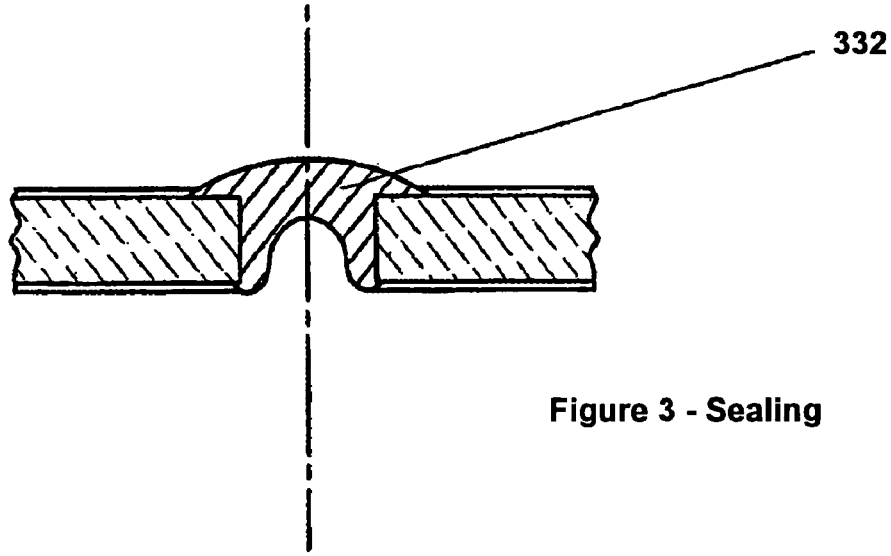
Figure 3 - Sealing

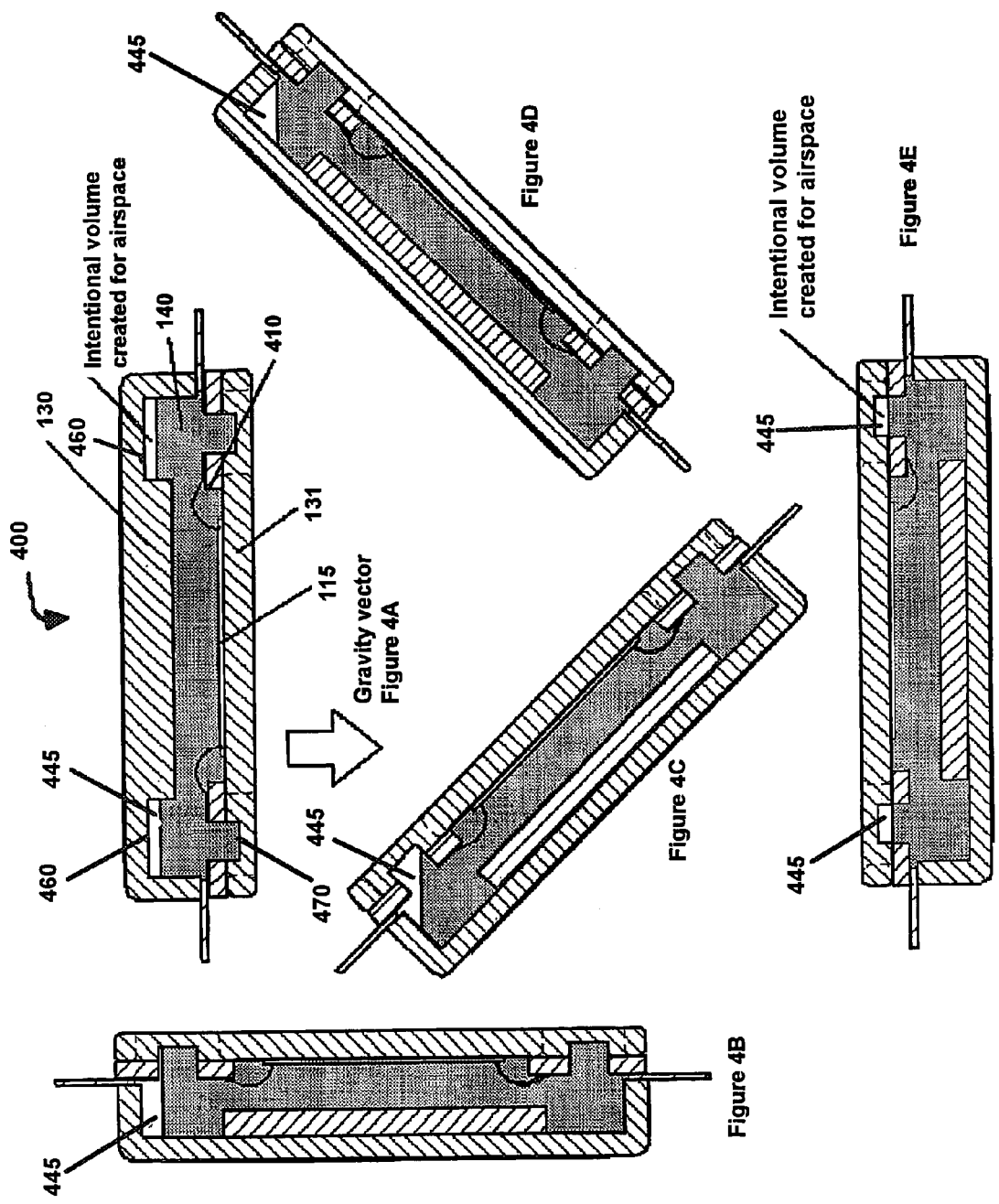

DIRECT CONTACT SEMICONDUCTOR COOLING

CROSS REFERENCE TO RELATED APPLICATIONS

This application claims the benefit of, and priority to, provisional application Ser. No. 60/481,630, filed Nov. 12, 2003, which application is hereby incorporated by reference in its entirety.

FIELD OF THE INVENTION

The present invention generally relates to systems and methods for enhancing the cooling of a semiconductor chip at the circuit level. More particularly, the present invention relates to direct contact semiconductor cooling of heat dissipating electronic features on semiconductor devices, such as those having small geometries.

BACKGROUND OF THE INVENTION

Excessive temperatures can degrade the performance of semiconductor devices. As an example, in an integrated circuit ("I") chip, heat is generally generated through the operation of various integrated circuit devices on the chip. The heat from the individual IC devices is often conducted away from the IC devices to a heatsink. In a typical Personal Computer, heat from the heatsink may be transmitted to the air within a computer tower, for example, using fans to draw heat away from the semiconductor chip. Fans may then be used to remove heated air from the interior of the computer tower. Attempts have been made to improve the thermal conductivity at each stage in the heat removal process discussed above.

Specifically, at the semiconductor device level, various techniques have been developed to remove heat from the locality surrounding a semiconductor device. These efforts included making the semiconductor substrate very thin. For example some semiconductor substrates may be made about 25–50 microns thick. This thickness reduction may reduce the thermal resistance through the semiconductor substrate, which often is a poor thermal conductor, e.g. made of silicon or gallium arsenide. In addition, various attempts have been made to increase the thermal conductivity of the semiconductor material itself. For example, GaN, SiC, and other such semiconductor materials have relatively higher thermal conductivities, but have other drawbacks. In another technique, heat dissipators are spaced apart from each other on the surface of the semiconductor substrate, and in this manner improve the opportunity for heat to be conducted away from the substrate.

Another technique for improving the rate of removal of heat from a semiconductor heat source involves maximizing the thermal conductivity of the die attach medium (for example by using AuSn, and/or the like), and maximizing the thermal conductivity of the package base (for example, by using Cu, CuW, CuMo, and AlSiC materials, and less commonly, by using Be, BeO, Be—BeO, graphite, Cx (diamond), Silvar™, and/or like materials, or by using heatpipes or heatplanes).

Although these methods may be partially effective, it continues to be desirable to further improve the heat transfer rates at the semiconductor device level. For example, undesirably high thermal resistance exists in applications where heat sources (e.g., transistor gates or channels) have a small geometry relative to the chip, package, and heatsink geometry. In this exemplary case, the thermal resistance path from these small heat dissipating geometries to the ultimate heatsink may primarily include both conduction resistance and convection resistance.

The conduction resistance may be influenced by the solid medium beneath the dissipators, e.g. the geometries and conductivities of materials comprising the semiconductor, its attachment, and local packaging. Furthermore, in some packaged devices, a solid medium above the dissipators may also be included as part of the conduction resistance. For example, a solid medium above the dissipators may comprise the plastic in an overmolded package. Often, reduction of conduction resistance may be bounded by the use of practical semiconductor and packaging materials.

The conduction resistance may also include a component of spreading resistance. Spreading resistance may include the added thermal resistance encountered due to geometrical constrictions of heat flow. In the case of very small dissipators, e.g., a sub-micron power transistor gate located on the surface of a semiconductor substrate, the spreading resistance may be a significant contributor to undesirably high device temperatures.

If a device is not otherwise overmolded, as discussed above, the device may have air disposed above the semiconductor surface. In this example, heat may be transferred from the semiconductor heat dissipators to the air above them. Heat transfer through the air may include, for example, convection heat transfer. Convection heat transfer may be defined as the transfer of heat by the motion or mixing of molecules. Air, however, is a relatively good thermal insulator, and therefore resistance to this convection heat transfer is usually high relative to conduction resistances. In fact, convection resistance to air is generally high enough that the air is often ignored as a thermal path.

Thus, the ability to remove heat from an area near a heat generating device on an integrated circuit continues to be a limiting factor in the performance, reliability, and/or design capabilities of integrated circuit products. Furthermore, it is desirable to enhance the ability to remove heat from the small dissipating electronic feature geometries often found on semiconductor devices.

SUMMARY OF THE INVENTION

In accordance with various aspects of the present invention, thermal spreading resistance, such as that associated with small geometry electronic features that generate heat on a semiconductor, may be reduced through the addition of a thermal transfer fluid. For example, the thermal transfer fluid may be disposed in direct contact with semiconductor heat dissipators. In accordance with an exemplary embodiment, a dielectric fluid may be used within a volume between a semiconductor package and the semiconductor substrate. Therefore, in various exemplary embodiments of the present invention, direct thermal cooling may be employed to reduce the thermal spreading resistance often encountered in MMIC power amplifier devices. In accordance with further embodiments of the present invention, exemplary methods are described herein for sealing a thermal transfer fluid within a volume to facilitate direct thermal cooling.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIGS. 2 and 3 illustrate exemplary techniques for filling and sealing a fluid within a semiconductor package in accordance with an exemplary embodiment of the present invention; and FIGS. 4A–4E illustrate an exemplary package lid and base in accordance with an exemplary embodiment of the present invention.

DETAILED DESCRIPTIONS

Figure 1:
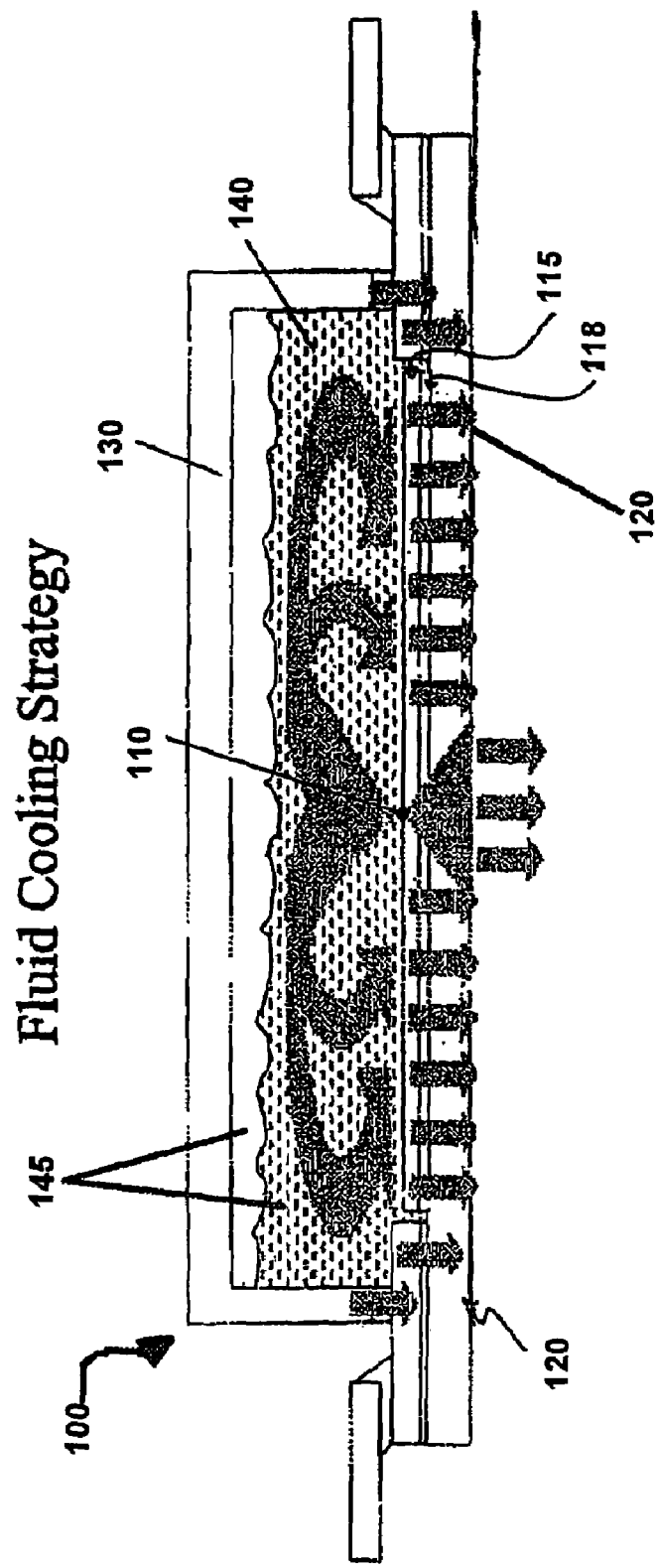
FIG. 1 illustrates a side cut-away view of an exemplary semiconductor package in accordance with an exemplary embodiment of the present invention.

In accordance with one aspect of the present invention, a semiconductor package may be configured to facilitate the removal of heat from a heat generating source, such as small dissipating electronic feature geometries. In accordance with an exemplary embodiment of the present invention, removal of heat from a heat source is facilitated via conduction and convection through a fluid in contact with the heat source. In accordance with another embodiment of the present invention, use of direct contact fluid cooling systems may reduce thermal spreading resistance.

As described above, the removal of heat from the local area where it was generated may facilitate enhanced performance of a semiconductor chip. For example, if heat is not removed at sufficient rate, the local temperature may increase enough to cause the chip to fail or to be de-rated or to operate less efficiently. On the other hand, a semiconductor chip having an improved ability to remove heat from the local source generating that heat may, for example, be able to accommodate higher voltages, greater current, increased efficiency, increased reliability, and/or increased switching frequency.

That being said, in accordance with an exemplary embodiment of the present invention, FIG. 1 illustrates, in cut away view, a semiconductor package employing direct contact semiconductor device cooling to remove heat from one or more heat sources located on the semiconductor chip. An exemplary heat flow pattern is also illustrated in FIG. 1. In accordance with an embodiment of the present invention, a packaged semiconductor chip 100 may employ direct semiconductor cooling by filling a volume, above a small heat source feature (e.g., 110), with a heat transfer fluid. In one exemplary embodiment of the present invention, the packaged semiconductor chip 100 comprises a heat source 110, a heatsink 120, a package 130 and a fluid 140. Fluid 140 may be disposed in contact with source 110 and within package 130. Furthermore, packaged semiconductor chip 100 may comprise additional components and devices.

In accordance with various exemplary embodiments of the present invention, semiconductor chip 100 may be a MMIC. For example, semiconductor chip 100 may be a GaAs amplifier MMIC. However, although described in conjunction with an MMIC device, the same principles may be applied to other devices. For example, the direct semiconductor cooling techniques described herein may be used in connection with any digital or analog chip that could benefit from a reduction in thermal resistance. For example, power amplifiers, Low Noise Amplifiers (LNAs), driver amplifiers, power transistors, 'flip-chips', grid amplifiers, microprocessors, and/or the like. Furthermore, packaged semiconductor chip 100 may comprise, for example, any semiconductor device (e.g. GaAs, GaN, Si, SiGe, SiC, etc.).

Packaged semiconductor chip 100 may also comprise any device where the heat dissipating geometries are small, and located on the surface of a relatively poor thermal conductor (e.g. Si, SiGe, GaAs). Furthermore, direct semiconductor cooling may be useful in any packaged power-dissipating semiconductor device that dissipates heat from relatively small geometry sources, i.e. devices in which spreading resistance is significant or undesirably large. Direct semiconductor cooling may also be advantageous for applications specifying high performance at elevated temperatures.

In addition, in accordance with yet another exemplary embodiment of the present invention, the semiconductor chip may be a high frequency (e.g.,>10 GHz) GaAs amplifier MMIC. Furthermore, in various exemplary embodiments, the semiconductor chip may be any high frequency device where the dissipating geometries are very small and/or the device is bounded in performance by the total thermal spreading resistance.

Packaged semiconductor chip 100 may also be packaged using suitable techniques and technology for housing, protecting, and/or enclosing the chip. In accordance with an exemplary embodiment of the present invention, the semiconductor chip is sealed within package 130. Package 130 may comprise, for example, a structure physically located over the surface of the chip. In accordance with an exemplary embodiment, package 130 may suitably comprise a housing, case, or any other encapsulating member.

In accordance with various exemplary embodiments of the present invention, a volume above heat source 110 may be created between source 110 and package 130 (or in other words, within an enclosed or encapsulated area). Thus, for example, packaged semiconductor chip 100 may comprise a package 130 that creates a volume 145, an enclosure, a void, a space, or a cavity above and/or around heat source 110. Package 130 may serve to protect the wire bonds and other sensitive portions of packaged semiconductor chip 100. Package 130 may surround the source, may encapsulate the source on all sides and above the source, and/or may cover the source. Thus, package 130 may define a volume 145 between the package and semiconductor substrate 115. Furthermore, the semiconductor chip may be sealed within package 130 in a leak proof manner. Thus, a sealed package 130 may retain a fluid within volume 145, without leaking that fluid, under reasonable operating conditions.

Package 130 may further be made of plastic, ceramic, metal, composite, and/or the like materials. However, package 130 may be made of any suitable material now known or later discovered for packaging and/or encapsulating a semiconductor chip. Furthermore, in other exemplary embodiments, a thermally conductive fluid may be added to the volume of, for example, a multichip module that comprises bare semiconductor devices and wherein the module enclosure is then sealed.

Thus, packaged semiconductor chip 100 may comprise any packaged, sealed semiconductor device(s) where enhanced thermal conductivity may be desirable. In particular, in accordance with various aspects of the present invention, packaged semiconductor chip 100 may comprise any packaged device that may benefit from high output power capabilities, high performance, high speed, and/or robustness.

In accordance with an exemplary embodiment of the present invention, packaged semiconductor chip 100 includes at least one heat source 110. For example, heat source 110 may comprise a field effect transistor ("FET"). In accordance with various other exemplary embodiments of the present invention, heat source 110 may also be a bipolar junction transistor ("BJT"), op amps, diodes, and/or the like. In other exemplary embodiments, heat source 110 may be any heat generating location in a semiconductor environment. For example, heat source 110 may be any feature level heat generating location, such as heat generating gates or PN junctions. Moreover, packaged semiconductor chip 100 may include multiple heat sources 110 in various locations on the semiconductor chip.

In accordance with various exemplary embodiments of the present invention, heat source 110 is part of a semiconductor substrate 115. Semiconductor substrate 115 may comprise various layers including, for example, devices, vias, and electrical paths, as well as various materials. Furthermore, semiconductor substrate 115 may comprise one or more sources. In accordance with an exemplary embodiment of the present invention, semiconductor substrate 115 is a thin, substantially planar, structure. Semiconductor substrate 115 may, for example, be configured with a heat source 110 located within substrate 115, near a top side of the substrate. In this example, a heatsink 120 may be attached to substrate 115 on a side of semiconductor substrate 115 opposite the top side. Heatsink 120 and substrate 115 may be attached using an attach medium 118, e.g., solder, glue, adhesives, and/or the like. Furthermore, packaged semiconductor chip 100 may comprise more than one semiconductor substrate 115 where each substrate may comprise zero or more heat sources 110.

In another exemplary embodiment, heat source 110 may be configured in a flip chip. In this example, a thermally conductive fluid may be added proximate to the flip chip, such that the fluid is in contact with one or more portions of the flip chip. The thermal transfer fluid, for example, may be disposed between the flip chip and the structure to which the flip chip is electrically connected. The fluid may, in another example, be disposed surrounding the outer portions of the flip chip.

In yet another exemplary embodiment, heat source 110 may be configured in a grid amplifier. For example, one or more heat sources may be configured in attachment to a metal frame grid and the heat transfer fluid may be disposed above, in between, and/or below the grid structure. Thus, direct contact semiconductor cooling may be facilitated in various devices and types of heat sources. Suitable packages may enclose these exemplary embodiments.

Packaged semiconductor chip 100 may be configured such that heat source 110 is in proximity to a heatsink 120. For example, heat source 110 may be located in semiconductor substrate 115, which is in parallel with and proximate to a heatsink layer. Thus, in this example, heatsink 120 may be on a bottom side of semiconductor substrate 115. However, as described above, the configuration of heatsink 120 may vary from application to application. In accordance with various aspects of the present invention, any suitable heatsink 120 now known or hereinafter developed may be used to draw heat away from the heat source. Furthermore, heatsink 120 may be attached to semiconductor substrate 115 using any suitable attachment medium. Nevertheless, in various exemplary embodiments, e.g., flip chip and/or grid amplifier, heatsink 120 may not be attached to semiconductor substrate 115. In that example, fluid 140 may facilitate the transfer of heat away from heat source 110.

In accordance with an exemplary embodiment of the present invention, the size of source 110 is smaller than the size of sink 120. Thus, although some of the heat generated by heat source 110 may flow directly from source 110 through sink 120, some of the heat may spread before that heat is removed by sink 120. For example, heat may be spread along the plane of sink 120 before dissipating. In another example, heat may be conducted through semiconductor substrate 115 in the plane of that substrate before being conducted through sink 120 to the outside environment. Furthermore, heat may also spread from heat source 110 through convection and/or radiation heat transfer through a space above the source.

In accordance with various aspects of the present invention, the size of the dissipating electronic features may be characterized by a ratio of the relative size of source 110 to that of sink 120. In this regard, semiconductor substrate 115 may be considered a substantially planar object having a source 120 located within that substrate and a "source area", $A_{source}$, may be defined in the plane of semiconductor substrate 115. For example, $A_{source}$ may represent the area that outlines the physical boundaries of heat source 110. In other exemplary embodiments, $A_{source}$ may be smaller or larger than the actual physical boundaries of heat source 110. Similarly, a "sink area", $A_{Sink}$ may be defined, for example, as the area of sink 120 that is thermally connected to semiconductor substrate 115. Furthermore, $A_{Sink}$ may be defined as an area about a single source, e.g., an average area per source. For example, if 10 sources are evenly placed over a 100 μm² sink, $A_{Sink}$ may equal 10 μm².

In one exemplary MMIC embodiment, $A_{Sink}$ is defined as the total area of the semiconductor substrate and $A_{source}$ is defined as the total area of the heat dissipators on the substrate. In this exemplary embodiment, small heat dissipating element 110 may be any heat dissipating element having a ratio $$\frac{A_{source}}{A_{Sink}} < 1/1{,}000,$$

a ratio $$\frac{A_{source}}{A_{Sink}} < 1/50{,}000$$

a ratio, $$\frac{A_{source}}{A_{Sink}} < 1/100{,}000,$$

and in yet further embodiments, a ratio $$\frac{A_{source}}{A_{Sink}} < 1/500{,}000.$$

Nevertheless, devices with other suitable ratios may also benefit from direct semiconductor cooling.

Other methods also may be used to characterize the size of source 110. For example, the relative size of source 110 and sink 120 may be represented by a suitable linear measurement as opposed to area measurement. For example, the width or length of a source in the semiconductor substrate 115 may be compared to a suitable measurement of the width or length of a sink.

In other exemplary embodiments of the present invention the size of the source 110 may be characterized as small, relative to sink 120, in semiconductor chips that are configured for greater than 10 GHz switching. For example, MMIC amplifiers that are configured for 10–100 GHz switching may have features that are small enough to give rise to significant spreading resistance. Devices employing other switching frequencies may also suitably benefit from direct semiconductor cooling.

Furthermore, direct semiconductor cooling may be employed in any configuration where the source is small enough, relative to the sink, that the spreading resistance is significant. Moreover, direct semiconductor cooling may be advantageously employed in any configuration where it facilitates heat transfer away from a heat source. Thus, the operating parameters of the device and/or the materials and construction of the semiconductor chip may individually or collectively influence whether spreading resistance and/or resistance to heat transfer is significant. For example, if a particular power level is desired, and heat removal is critical, then the spreading resistance may be significant. In each of these situations, direct semiconductor cooling may facilitate reduced thermal spreading resistance.

FIG. 1 illustrates an exemplary direct semiconductor cooling strategy with a thermal transfer fluid, e.g. a thermally conductive fluid. In accordance with one aspect of the present invention, filling volume 145 with fluid 140 facilitates enhanced heat transfer away from heat source 110 and/or reduces the combined thermal resistance of heat flow from the source. For example, volume 145 may be substantially filled with fluid 140. In accordance with other embodiments, volume 145 may only be partially filled with fluid 140.

Fluid 140 may be disposed in direct contact with a dissipating semiconductor device within a sealed component package or module. In one exemplary embodiment, direct contact may involve the fluid being disposed proximate to the heat generating device. For example, fluid 140 may contact the housing of a flip chip. In another example, fluid 140 may touch the surface of the semiconductor substrate. In other examples, direct contact may comprise the fluid being within approximately 100 microns of the heat source, 50 microns, 10 microns, 2 microns, and/or the like. For example, fluid 140 may be directly in contact with the finished wafer material of a substrate and the substrate may include a pasivation layer a few microns thick between the gate and the cooling fluid. E.g., a Silicon Nitride passivation layer between the surface and the device may be 1500 to 2000 Angstroms thick.

The fluid may facilitate the reduction of the thermal spreading resistance through the semiconductor substrate by providing a parallel thermal and/or natural convection and/or active convection path for heat to be transferred away from dissipating structures on the semiconductor surface. Fluid 140 may be any suitable fluid having properties that facilitate convection cooling, e.g., a heat transfer fluid or thermal transfer fluid. In accordance with an exemplary embodiment of the present invention, fluid 140 comprises a dielectric fluid. In accordance with other embodiments of the present invention, fluid 140 is electrically non-conductive.

Fluid 140 may, in various exemplary embodiments of the present invention, be selected based on desired operational and/or performance characteristics. In accordance with an exemplary embodiment of the present invention, fluid 140 may comprise one or more of the following properties or characteristics: a sufficiently high breakdown temperature threshold, e.g., 320° F. or other suitable breakdown temperature thresholds; a sufficiently low freeze point temperature, e.g., −70° C., or other suitable freeze point; stability with all contacted materials for the design life of the semiconductor chip; sufficiently low loss properties, e.g., a low permittivity and/or a low loss tangent (both at the applicable frequencies); fluidity, or in other words, a low viscosity, to facilitate natural convective heat transfer; thermal conductivity of the fluid; and a sufficiently high boiling temperature to preclude phase change, e.g., greater than 200° C. or other suitable phase change temperatures.

In accordance with an exemplary embodiment of the present invention, fluid 140 may comprise a liquid. In other exemplary embodiments, fluid 140 may comprise a gel. A gel may be used to the extent that it facilitates convection and/or conduction heat transfer near the heat source. Fluid 140 does not comprise a gas or air.

The fluid to be used for direct cooling may be any one of a number of fluids now known or hereinafter developed that have suitable properties as described herein. For example, in addition to dielectric fluids, exemplary fluids include the cooling fluids used in some electrical transformers, capacitor fluids, and/or fluids used as coolants over printed circuit board assemblies. Exemplary fluids may include: Coolanol 25R by Esso/Exxon, comprising a Silicate ester; FLUTEC liquids by F2 Chemical Ltd, UK, comprising Fluorocarbon; FLUTEC PP9; Insulating oil/compound, e.g. #1725, by Hohne GmbH, Germany, comprising Synthetic oil; perflourocarbon fluids, Dow Corning DC-200, comprising a dimethyl silicon fluid; and/or Dowtherm J, comprising an aromatic oil. Moreover, in accordance with various aspects of the present invention, in an RF embodiment, the fluid may be any fluid, or combination of fluids, combining high dielectric strength and resistivity with low values of permittivity and dielectric loss (exclusive of air).

Packaged semiconductor chip 100 may be configured such that fluid 140 is in direct contact with semiconductor substrate 115. In various exemplary embodiments of the present invention, package 130 may comprise any suitable package design, including package designs previously used, now used, and any package designs that may be developed in the future. However, in accordance with other exemplary embodiments of the present invention, package 130 may be modified to facilitate the addition of fluid 140, the sealing of fluid 140 within package 130, and/or to facilitate fluid contact with source 140 at various orientations of the overall package.

For example, FIGS. 2 and 3 illustrate an exemplary lid design associated with package 130, where the lid design is configured to facilitate the filling of volume 145 with fluid 140, and to seal fluid 140 in that volume. For example, package 130 may be configured to include a hermetic component lid 231 having a hole 234 that may be configured to receive a preform 232 and needle 233. Preform 232 may be a solder or equivalent structure that is configured to be received in hole 234 of lid 231 and to receive a needle 233. In accordance with various exemplary embodiments of the present invention, fluid 140 is retained within volume 145 via a seal 332. Seal 332 may be an epoxy seal, metallic seal (e.g. gold-tin solder or a seal weld), and/or the like.

One exemplary method of filling volume 145 comprises the steps of: configuring a package 130 to create a volume between semiconductor substrate 115 and the package, preparing package 130 to facilitate filling volume 145 with a fluid, filling volume 145 with fluid 140, and sealing fluid 140 within package 130. In one exemplary embodiment, the step of preparing package 130 with a device for filling volume 145 further comprises the steps of configuring a preform of solder in a hermetic component lid and configuring package 130 with the hermetic component lid. After injecting fluid 140, the solder preform 232 may be heated and caused to form a solder seal 332. These steps may also be performed in one or more other orders. In yet further exemplary embodiments, volume 145 may be completely filled with fluid 140, or the volume may be partially filled. Furthermore, in various embodiments, the air may be fully evacuated from volume 145. Moreover, any method of sealing fluid 140 within volume 145 may be used. In addition, package 130 may be configured to prevent fluid 140 from leaking out of volume 145.

Furthermore, packaged semiconductor chip 100 may be configured such that it may be physically oriented in any direction or otherwise subjected to movement without leaking or spilling of fluid 140. In one exemplary aspect of the present invention, modifying package 130 and/or volume 145 may increase the possibility that fluid 140 remains in contact with heat source 110. For example, package 130 and/or volume 145 may be configured to cause fluid 140 to remain in contact with source 110 when packaged semiconductor chip 100 is oriented in various directions. In one exemplary embodiment, one or more trenches are oriented to control the location of air pockets at various orientations. In another embodiment of the present invention, at any orientation of packaged semiconductor chip 100, fluid 140 may be in contact with heat source 110.

FIGS. 4A–E illustrate an exemplary package lid 130 and package base 131 and a dielectric fluid disposed between the two objects. Package base 131 may comprise, for example, a heat sink. A semiconductor substrate 115 is located on an inner surface of package base 131. The assembly further may include wirebonds 410 in the enclosed space between the package lid and base. In accordance with one embodiment, trenches, voids, or other volumes are created in the package base and/or lid. For example, trenches 460 and 470 may be suitably configured in package lid 130 and package base 131, respectively. In various embodiments, package base 131 may be referred to as a heatsink and/or die carrier.

In an exemplary embodiment, trenches 460 and 470 may be formed, cut, or otherwise created in the package base and lid using suitable manufacturing techniques. Furthermore, trenches 460 and 470 may be configured to be of a suitable shape, depth, length and width for causing enclosed gases to be retained substantially away from the semiconductor surface.

In this exemplary embodiment, a semiconductor package 400 is illustrated disposed at various angles with respect to gravity. See FIGS. 4A–4E. For example, the package is illustrated at level (FIG. 4A), at 45 degree angles (FIGS. 4C and 4D), at 90 degrees from level (FIG. 4B), and 180 degrees from level, or upside down (FIG. 4E). In each embodiment, in the event that a gas 445 is enclosed with the fluid, the gas is maintained at a distance from the semiconductor surface. Thus, direct contact cooling is facilitated in various orientations of package 400. Other shapes and patterns of trenches may similarly be used to control the location of enclosed gases, such as air.

In exemplary embodiments, this invention may be used within a sealed semiconductor package. The technology may be applicable, however, to open systems as well. Thus, although describe herein as a sealed system, one or more semiconductors may be configured to have a thermally conductive fluid in direct contact with the surface of the semiconductor, where the fluid is not sealed within a package. For example, the fluid or gel may be applied in an open environment.

The use of direct semiconductor cooling via addition of fluid 140 to a packaged semiconductor chip 100 may, for example, facilitate a device that runs cooler (e.g., lower gate temperatures). Direct semiconductor cooling may also facilitate a device that can be biased to higher voltages and/or currents. Furthermore, direct semiconductor cooling may facilitate a combination of these and other results. Thus, direct semiconductor cooling may facilitate achieving an otherwise unachievable higher semiconductor output, lower gate temperature, and/or higher reliability.

Enhancing the thermal conductivity may also be characterized as reducing the effective thermal spreading resistance that normally exists from the small dissipating geometries of a semiconductor die to the component package case, e.g. theta j-c (the thermal coefficient from the junction to the case). In one test, the thermal resistance for a MMIC Power Amplifier mounted within a boltdown package with CuW base with only air above source 110 was calculated to be about 4 C/W; whereas, on the other hand, the combined thermal resistance for a MMIC in the same package with a dielectric fluid (modeled to give an equivalent thermal conductivity of 100 W/mK) above heat source 110 has been calculated to be about 1 to 1.5 C/W. Thus, the thermal resistance may be reduced by more than 50%. In other exemplary embodiments, and depending on, for example, fluid properties and geometries, combined thermal conductance may be improved by 25% to 500% over that of air.

In accordance with various exemplary embodiments of the present invention, heat may flow through a 'source to fluid to semiconductor substrate' path that may exist in parallel to the 'source to semiconductor substrate' heat flow path. Filling volume 145 with fluid 140 thus may create a parallel path to the heatsink, or replace an air path with a fluid path of higher effective thermal conductivity. This facilitates heat spreading to other portions of the semiconductor substrate and package via a path of high thermal conductivity. As a result, passive cooling may be realized.

It should be appreciated that the particular implementations shown and described herein are illustrative of the invention and its best mode and are not intended to otherwise limit the scope of the present invention in any way. Indeed, for the sake of brevity, conventional signal processing, data transmission, and other functional aspects of the systems (and components of the individual FsFoperating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical direct cooling systems.

The present invention has been described above with reference to one or more preferred embodiments. However, those skilled in the art having read this disclosure will recognize that changes and modifications may be made to the preferred embodiments without departing from the scope of the present invention. These and other changes or modifications are intended to be included within the scope of the present invention, as expressed in the following claims.

We claim:
1. A semiconductor package comprising:
a semiconductor substrate having a first side and a second side opposite said first side, wherein said semiconductor substrate comprises a heat source;
a heatsink configured on said first side of said semiconductor substrate, wherein said heatsink is configured to remove heat from said semiconductor substrate;

a package configured on said second side of said semiconductor substrate and forming a volume between said package and said semiconductor substrate; and a heat transfer fluid within said volume, wherein a combined thermal conductance is improved by 25 to 500%, over the thermal conductance of air, due to the addition of said heat transfer fluid.

2. A semiconductor package comprising:

a semiconductor substrate having a first side and a second side opposite said first side, wherein said semiconductor substrate comprises a heat source;

a heatsink configured on said first side of said semiconductor substrate, wherein said heatsink is configured to remove heat from said semiconductor substrate;

a package configured on said second side of said semiconductor substrate and forming a volume between said package and said semiconductor substrate; and a heat transfer fluid within said volume, wherein said semiconductor package comprises a MMIC power amplifier.

3. The semiconductor package of claim 2, wherein said MMIC power amplifier is configured to be biased such that a maximum power output of said MMIC power amplifier is increased by 10 to 40% with respect to the same MMIC power amplifier without said heat conductive fluid.

4. An electronic configuration for removing heat from small dissipating electronic features on a semiconductor comprising:

a semiconductor device located on a substrate, said semiconductor device being defined by a first area on said substrate;

a heatsink configured in proximity to said substrate and configured to remove heat from said substrate, wherein said heatsink is defined by a second area on said substrate, and wherein the ratio of said first area divided by said second area is less than 0.001; and a heat transfer fluid in direct contact with said substrate, wherein said heat transfer fluid is configured to remove heat from said semiconductor device, and wherein said heat transfer fluid is electrically non-conductive.

5. The electronic configuration of claim 4, wherein the small dissipating electronic feature is a field effect transistor in a MMIC power amplifier.

6. A method of manufacturing a semiconductor package, the method comprising the steps of:

semiconductor substrate, wherein said package creates a volume, wherein said package is capable of retaining a fluid in proximity to said semiconductor;

adding a thermal transfer fluid within said packages, attaching a heatsink to said semiconductor;

adding a hermetic component lid to said package and configuring said hermetic component lid with a shaped preform of solder;

wherein said adding step further comprises inserting a hypodermic needle though an opening in said hermetic component lid and adding said thermal transfer fluid through said hypodermic needle; and sealing said thermal transfer fluid within said package by heating said preform of solder.

* * * * *

UNITED STATES PATENT AND TRADEMARK OFFICE
CERTIFICATE OF CORRECTION

| | |
|---|---|
| PATENT NO. | : 7,157,793 B2 |
| APPLICATION NO. | : 10/849097 |
| DATED | : January 2, 2007 |
| INVENTOR(S) | : Torkington et al. |

Page 1 of 2

It is certified that error appears in the above-identified patent and that said Letters Patent is hereby corrected as shown below:

Col. 12, Line 13

Claim 6 should read as follows (with underlining, showing words the Office incorrectly omitted and brackets showing material incorrectly added by the Office):

6. A method of manufacturing a semiconductor package, the method comprising the steps of:

packaging a semiconductor substrate, wherein said package creates a volume, wherein said package is capable of retaining a fluid in proximity to said semiconductor;

adding a thermal transfer fluid within said package[[s]], attaching a heatsink to said semiconductor;

adding a hermetic component lid to said package and configuring said hermetic component lid with a shaped preform of solder;

wherein said adding step further comprises inserting a hypodermic needle through an opening in said hermetic component lid and adding said thermal transfer fluid through said hypodermic needle; and

UNITED STATES PATENT AND TRADEMARK OFFICE
CERTIFICATE OF CORRECTION

PATENT NO. : 7,157,793 B2
APPLICATION NO. : 10/849097
DATED : January 2, 2007
INVENTOR(S) : Torkington et al.

It is certified that error appears in the above-identified patent and that said Letters Patent is hereby corrected as shown below:

sealing said thermal transfer fluid within said package by heating said preform of solder.

Signed and Sealed this

Twenty-seventh Day of March, 2007

JON W. DUDAS
*Director of the United States Patent and Trademark Office*